United States Patent [19]

Ganschow

[11] Patent Number: 5,482,874
[45] Date of Patent: Jan. 9, 1996

[54] INVERSION IMPLANT ISOLATION PROCESS

[75] Inventor: George E. Ganschow, Trabuco Canyon, Calif.

[73] Assignee: National Semiconductor Corporation, Santa Clara, Calif.

[21] Appl. No.: 154,891

[22] Filed: Nov. 19, 1993

Related U.S. Application Data

[62] Division of Ser. No. 44,560, Apr. 7, 1993, Pat. No. 5,289,024, which is a continuation of Ser. No. 821,256, Jan. 10, 1992, abandoned, which is a continuation of Ser. No. 564,013, Aug. 7, 1990, abandoned.

[51] Int. Cl.$^6$ .......................... H01L 21/265; H01R 21/22
[52] U.S. Cl. .............. 437/31; 437/33; 437/157; 437/986
[58] Field of Search .................... 437/70, 157, 31, 437/953, 986, 32, 33; 148/DIG. 44, DIG. 8, DIG. 9, DIG. 10, DIG. 11

[56] References Cited

U.S. PATENT DOCUMENTS

| | | | |
|---|---|---|---|
| 3,648,125 | 3/1972 | Peltzer | 317/235 |
| 3,748,187 | 7/1973 | Aubuchon et al. | 437/70 |
| 3,962,717 | 6/1976 | O'Brien | 357/44 |
| 4,047,975 | 9/1977 | Widmann | 437/31 |
| 4,082,571 | 4/1978 | Graul et al. | 148/1.5 |
| 4,435,898 | 3/1984 | Gaur et al. | 437/31 |
| 4,492,008 | 1/1985 | Anantha et al. | 29/571 |
| 4,609,568 | 9/1986 | Koh et al. | 427/85 |
| 4,616,401 | 10/1986 | Takeuchi | 437/70 |
| 4,617,071 | 10/1986 | Vora | 148/188 |
| 4,764,480 | 8/1988 | Vora | 437/54 |
| 4,769,687 | 9/1988 | Nakazato et al. | 357/35 |
| 4,839,302 | 6/1989 | Kameyama et al. | 437/31 |
| 4,879,252 | 11/1989 | Komatsu | 437/31 |
| 4,961,102 | 10/1990 | Shideler et al. | 357/51 |
| 4,962,053 | 10/1990 | Spratt et al. | 437/31 |
| 4,992,843 | 2/1991 | Blossfeld et al. | 357/34 |
| 5,014,107 | 5/1991 | Vora | 357/44 |
| 5,077,227 | 12/1991 | Kameyama et al. | 437/31 |
| 5,139,961 | 8/1992 | Solheim et al. | 437/33 |

*Primary Examiner*—Olik Chaudhuri
*Assistant Examiner*—Brian K. Dutton
*Attorney, Agent, or Firm*—Skjerven, Morrill, MacPherson, Franklin & Friel

[57] ABSTRACT

A method for improving the performance of a walled emitter bipolar-junction transistor and the improved walled emitter bipolar junction transistor resulting therefrom are disclosed. The method involves the incorporation of a p-type dopant, preferably boron, at the intersection of the isolation oxide and the emitter-base region. The selective implantation does not affect the transistor's function in any significant way, does not complicate the fabrication process to any significant degree and eliminates known problems of intrinsic base boron segregation and oxide charges in known walled emitter bipolar junction transistors.

14 Claims, 7 Drawing Sheets

INVERSION IMPLANT ISOLATION PROCESS

CROSS-REFERENCE TO RELATED APPLICATIONS

This application is a Rule 60 Division of U.S. patent application Ser. No. 08/044,560, filed Apr. 7, 1993, now U.S. Pat. No. 5,289,024 which is a File Wrapper Continuation of U.S. patent application Ser. No. 07/821,256, filed Jan. 10, 1992, now abandoned, which is a File Wrapper Continuation of U.S. Ser. No. 07/564,013, filed Aug. 7, 1990, now abandoned.

BACKGROUND OF THE INVENTION

The present invention relates to the field of semiconductor devices and their manufacture. More specifically, in one embodiment the invention teaches the selective implantation of p-type dopants such as boron to improve the performance of bipolar junction transistors ("BJTs").

BJTs and their fabrication on semiconductor wafers are known. In order to fabricate BJTs with reduced size, it is often desirable to fabricate such transistors with a walled emitter. A "walled emitter" BJT is a BJT in which the emitter of the transistor intersects the isolation oxide. Transistors with walled emitters generally require reduced amounts of layout area per transistor. For comparison, in a non-walled emitter BJT, the emitter is separated from the isolation oxide, the resultant structure having a generally uniform emitter-base edge profile on all edges. This type of transistor usually requires more layout area for a given lithography technique than a walled emitter BJT.

Walled emitters have several disadvantages, among which are collector-emitter leakage currents ("$I_{CEO}$") at the edges of the walled emitter. $I_{CEO}$ is the current which flows between the collector and emitter when the base terminal of the transistor is not biased at a given collector-emitter voltage. $I_{CEO}$ is generally measured when the collector-emitter voltage is maintained within the normal operating region, not when the transistor is operated at the breakdown voltage, and $I_{CEO}$ is ideally zero.

$I_{CEO}$ can be non-zero due to a number of factors. The walled emitter edge can be reduced in base width and/or mobile charge carrier concentration due to intrinsic base boron segregation into the field oxide. This reduction in base width can increase $I_{CEO}$.

Oxide charges present in the field oxide region can also cause an inversion of the P-type intrinsic base region at the edge of the walled emitter, decreasing the base width and/or mobile charge carrier concentration. This also results in an increase in $I_{CEO}$.

Base width can also be reduced at the edge of the walled emitter edge where the devices have been fabricated with implanted, diffused and polysilicon emitter devices. In such devices, if the isolation oxide window is larger than the window that defined the intrinsic base region, the oxide can etch and enlarge the active window between the base and the emitter.

The known methods for reducing or controlling $I_{CEO}$ leakage in walled emitters has generally tended to reduce the performance of the BJTs.

For example, increasing the base width or increasing the mobile charge carrier concentration in the base region both reduce the performance of the BJT by increasing the transit time of charges in the base region and by increasing the parasitic capacitances of the BJTs.

The use of a high energy, low dose secondary base implant that penetrates the "bird's beak" at the edge of the isolation zone, and which increases the base width and charge at the edge of the walled emitter is also known. Unfortunately, this method increases both the base junction depth of the device and the electrical signal transit time for the transistor while increasing parasitic capacitances.

It would be of significant advantage if a new method for controlling $I_{CEO}$ currents in a BJT having a walled emitter could be developed without the performance penalties of the known art.

SUMMARY OF THE INVENTION

A method for improving the performance of a walled emitter BJT and the BJT resulting therefrom is herein described. The method involves the incorporation of boron or another p-type dopant selectively at the intersection of the isolation oxide and the emitter-base region.

This selective incorporation of boron has several benefits. The boron compensates for intrinsic base boron segregation during field oxidation, reducing the propensity towards inversion in the area near the field oxide. The boron also compensates for oxide charge in the field oxide which, if unchecked, could cause or contribute to the inversion of the p-type base region.

By compensating for both the intrinsic base boron segregation and the oxide charges, the desired base width can be maintained at the emitter-isolation edge and the $I_{CEO}$ can be reduced. The reduction of the $I_{CEO}$ increases noise margins, thereby improving the signal to noise ratio.

This technique has several advantages over the known art. The boron results in only small increases in the parasitic capacitance of the device, which preserves the desired BJT performance, particularly the BJT's base transit time. The boron implantation also requires a minimal increase in the complexity of the manufacturing process, and can be easily integrated into the standard ISOPLANAR or related isolation processes such as in, for example, Peltzer, U.S. Pat. No. 3,648,125, which is incorporated herein by reference for all purposes.

The invention incorporates a self-aligned inversion implant step and an annealing step into well known oxide isolation processes. The invention results in the controlled placement of boron near the "bird's beak" between the emitter and base, which provides $I_{CEO}$ leakage current reduction at the emitter edge without affecting the bulk of the active intrinsic base.

The invention can also be incorporated in conventional vertical trench isolation processes. The inversion implant and annealing steps are performed after a trench sacrificial mask etch step and before a silicon trench etch step. In this manner, the boron concentration is increased at the top edge of the trench, in the same manner as in the oxide isolation process. This allows active devices to be walled against the trench.

A further understanding of the nature and advantages of the invention herein may be realized by reference to the remaining portions of the specification and the attached drawings.

DETAILED DESCRIPTION OF THE PREFERRED EMBODIMENTS

I. General

Figure 1A:
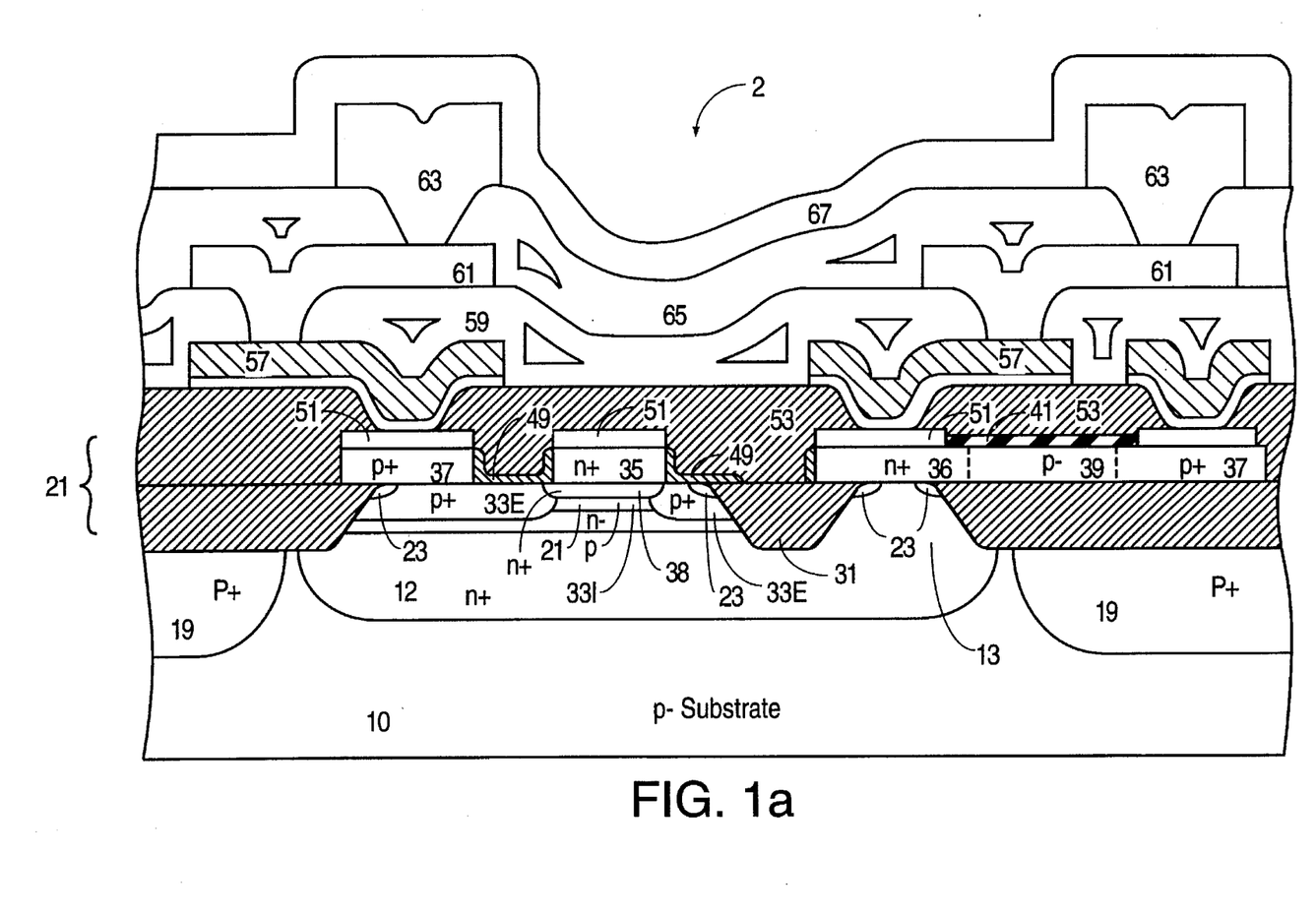
FIGS. 1a and 1b are cross-sections of the BiCMOS structure according to one embodiment of the invention.
Figure 1B:
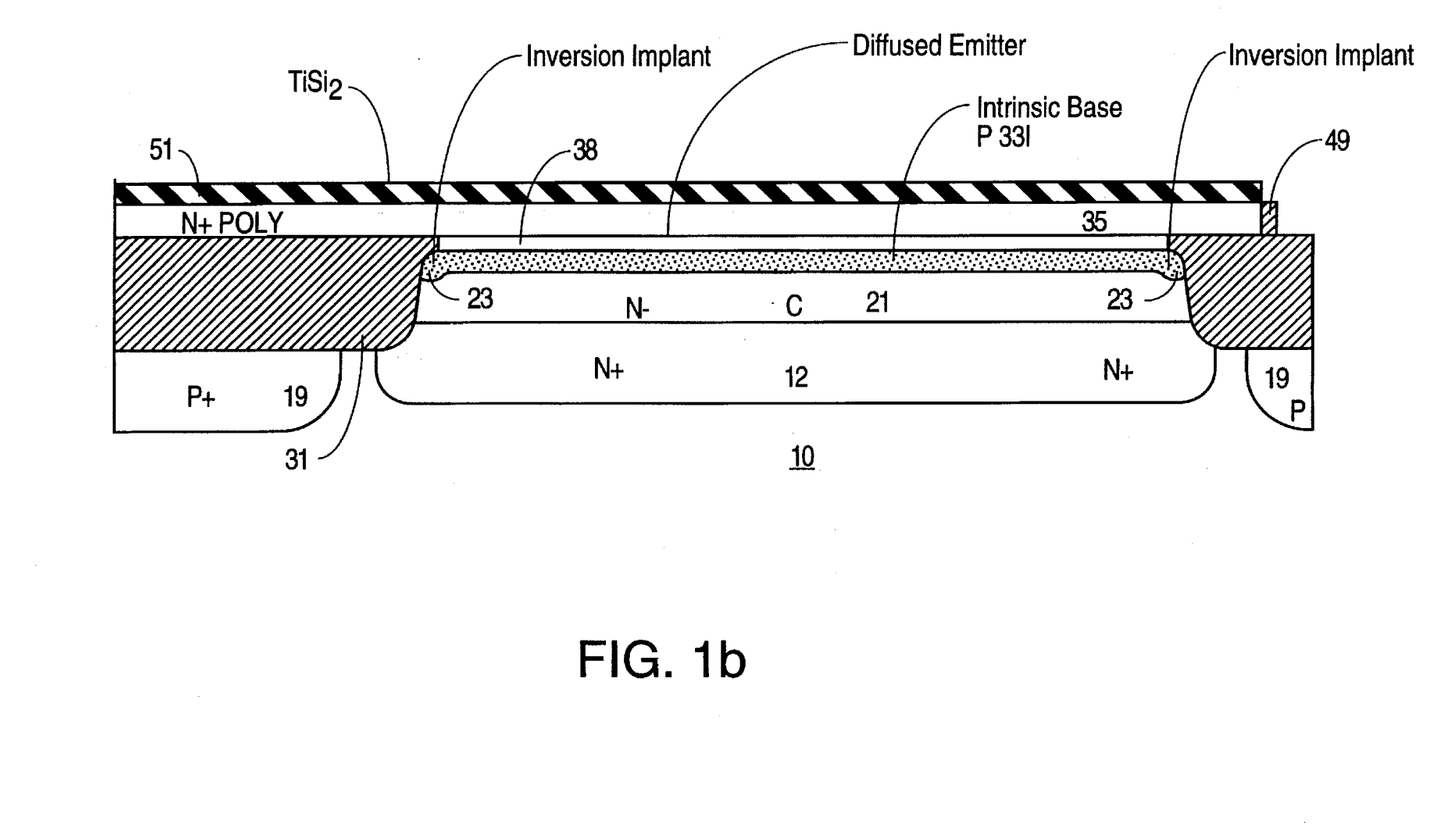

FIGS. 1a and 1b illustrate a bipolar transistor 2, which in the embodiment shown in FIG. 1 is an NPN transistor. The cross section in FIG. 1b is taken through the emitter 35 shown in FIG. 1a. The device is fabricated on substrate 10. In the embodiment shown in FIG. 1 the substrate is a p-substrate having a dopant concentration of between about $1\times10^{13}$ and $1\times10^{16}$, the preferred range being between $2\times10^{14}$ and $3\times10^{15}/cm^3$. A reduced pressure doped n-type epitaxial silicon layer 21 is grown on top of the substrate and the devices are fabricated in the epitaxial layer.

The NPN transistor 2 is provided with a heavily doped buried layer 12 and collector sink 13, which together provide a low resistance connection region between a collector contact 36 and a collector C formed in epitaxial layer 21. In preferred embodiments the buried layer 12 and sink 13 are doped to a peak dopant concentration of between about $1\times10^{17}$ and $1\times10^{20}$ with a preferred range of about $5\times10^{18}$ to $1\times10^{20}/cm^3$.

A p+ channel stop 19 is provided between the NPN transistor and adjacent devices to prevent surface inversion of the lightly doped substrate which would connect the buried layer 12 with adjacent devices. Between transistor 2 and other transistors and between sink 13 and base 33, oxide isolation regions 31 are provided which, typically, will be $SiO_2$ for device isolation. Boron implant regions 23 are placed at the intersection of oxide isolation regions 31 and base region 15. The boron implants 23 will not substantially change the dopant concentration of the extrinsic base regions 33E. However, at the edges of the intrinsic base region 33I adjacent to the field oxide region the boron implants will substantially compensate for the out-diffusion of boron into the field oxide. In some embodiments, the implant will slightly increase the base width in the region directly adjacent to the field oxide under the emitter contact as shown in FIG. 1b to insure complete compensation for out-diffusing boron.

Along the surface of the device and formed from a single layer of deposited polycrystalline silicon (polysilicon) are a resistor 39, base contact 37, emitter contact 35, and a collector contact 36. An emitter region 38 is diffused into the monocrystalline epitaxial layer from emitter contact 35. Sidewall oxide 49 is provided on the sidewalls of the bipolar emitter contact 35. It is to be understood that while region 35 is referred to herein as an emitter contact and region 38 as an emitter, one of skill in the art may sometimes collectively refer to the combination of regions 35 and 38 as the "emitter". No difference in meaning is intended.

Refractory metal silicide contacts 51 are formed on the p+ bipolar transistor base contact 37. A separate silicide contact 53 is provided along the top portion of the emitter contact 35 between the sidewall spacer oxide regions 49. Similarly, silicide contacts 51 are provided for the collector contact 36.

The structure further includes a thick (0.8 to 1.3 and preferably about 1.3 μm) oxide layer 53 to insulate the devices from metal layer 57, which is used for interconnection purposes. Tungsten plugs may optionally fill the apertures in oxide layer 59 between the first metal layer and the various silicide regions. Additional metal/oxide interconnect layers 61, 63 may be provided, topped by a passivation layer 69.

II. Fabrication Sequence of BiCMOS Device

Figure 2A:
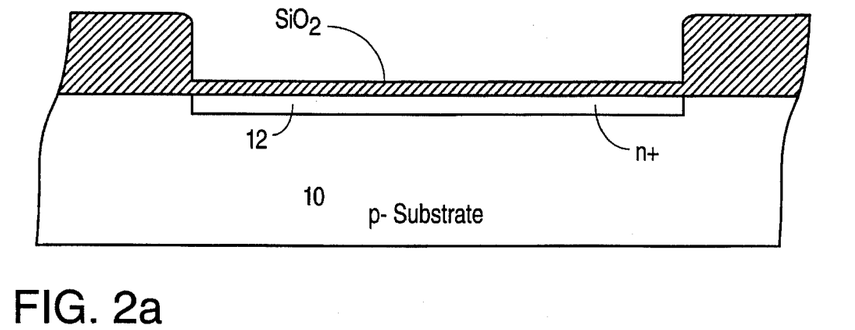
FIGS. 2a to 2o illustrate the fabrication of a BiCMOS device incorporating the present invention.
Figure 2B:
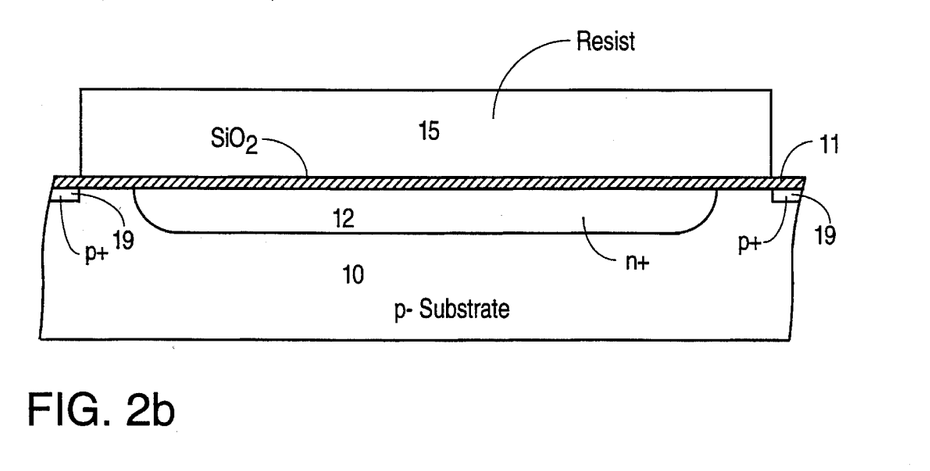
Figure 2C:
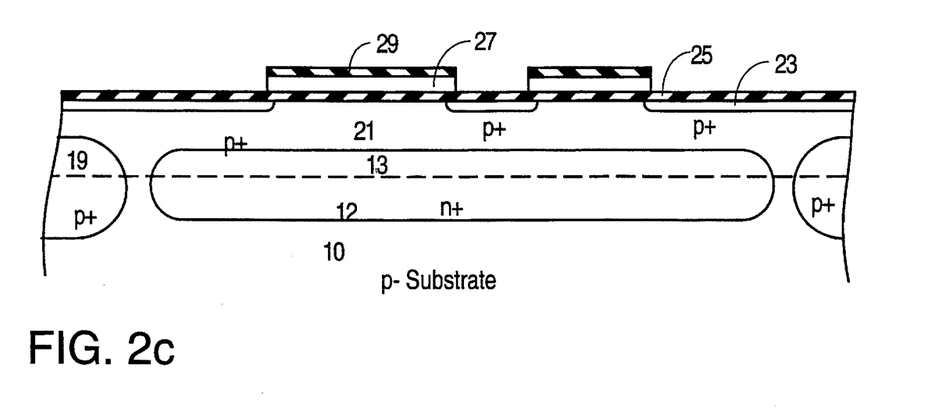
Figure 2D:
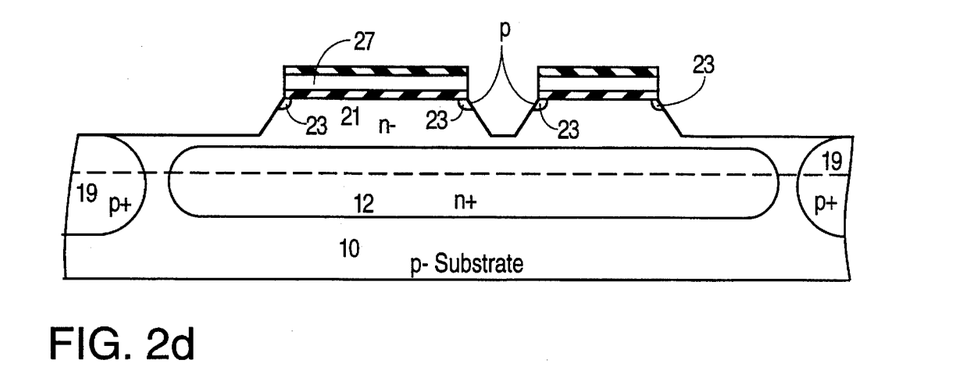
Figure 2E:
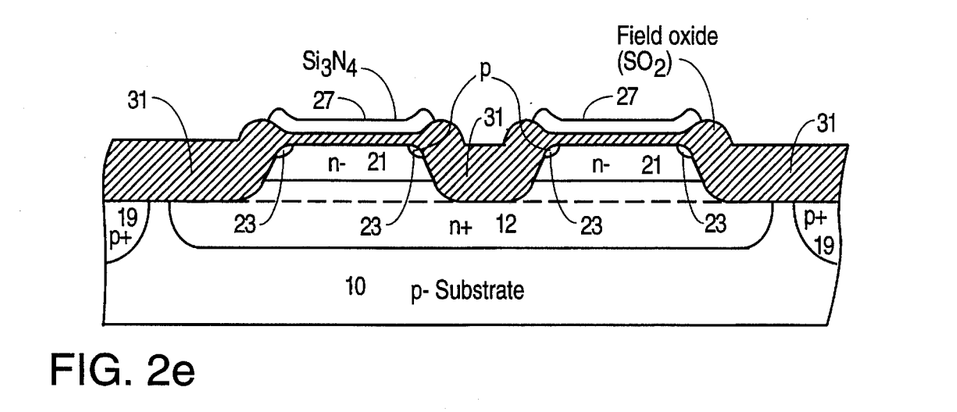
Figure 2F:
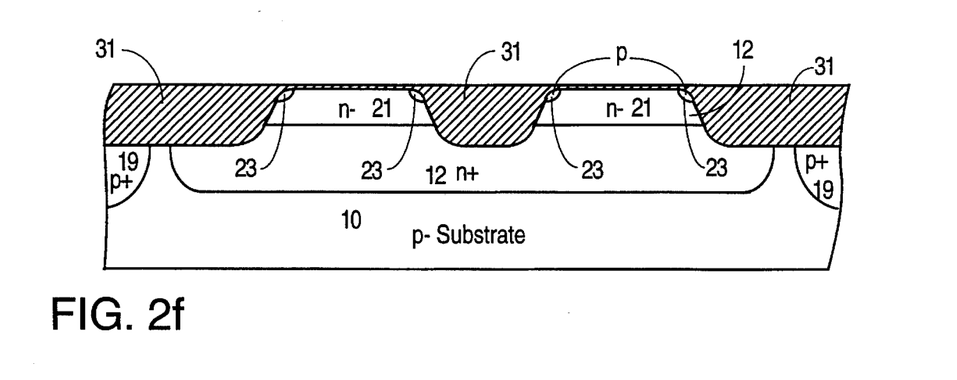
Figure 2G:
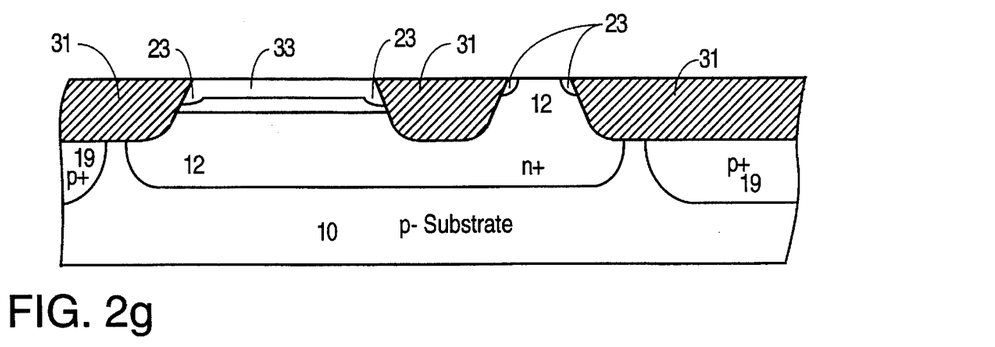
Figure 2H:
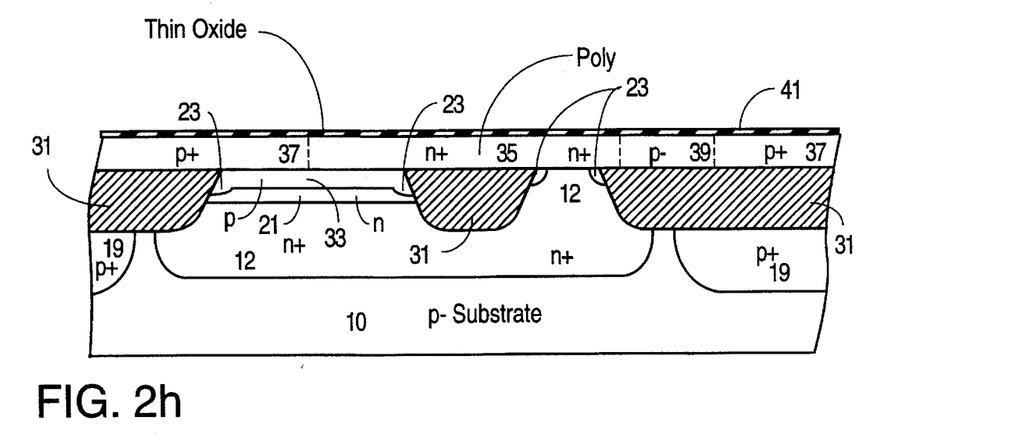
Figure 2I:
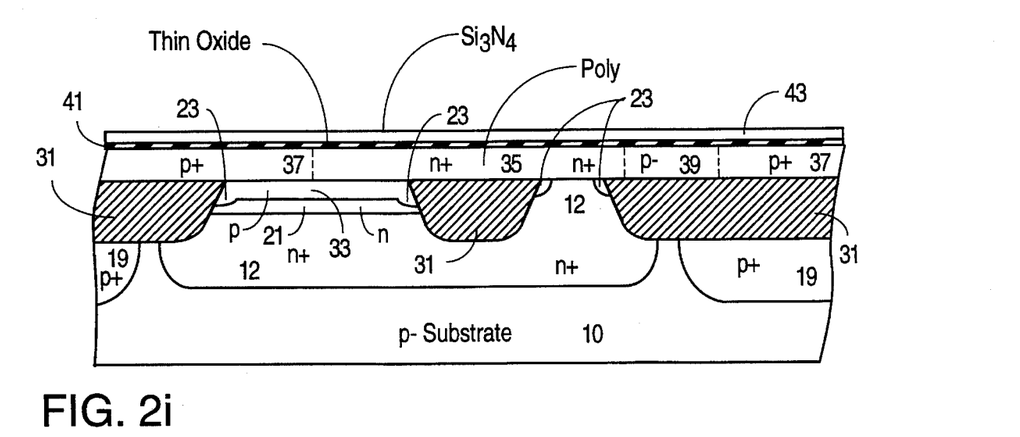
Figure 2J:
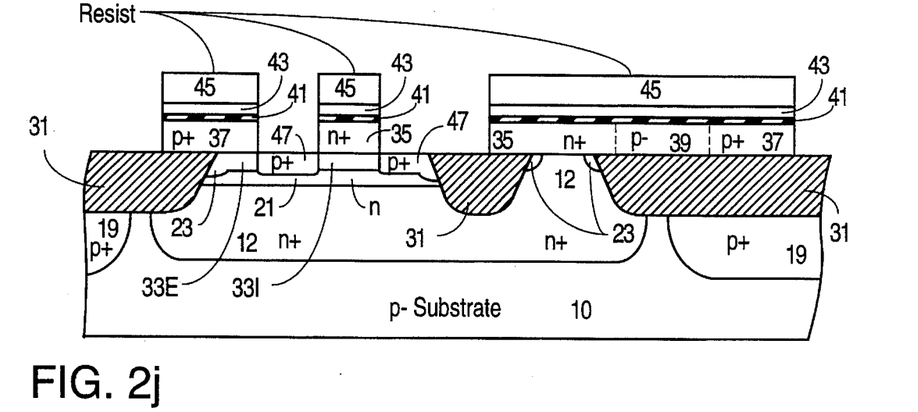
Figure 2K:
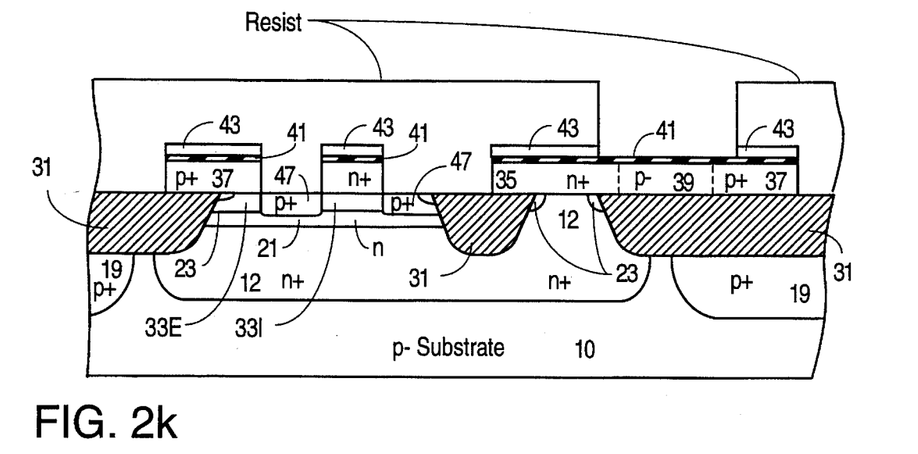
Figure 2L:
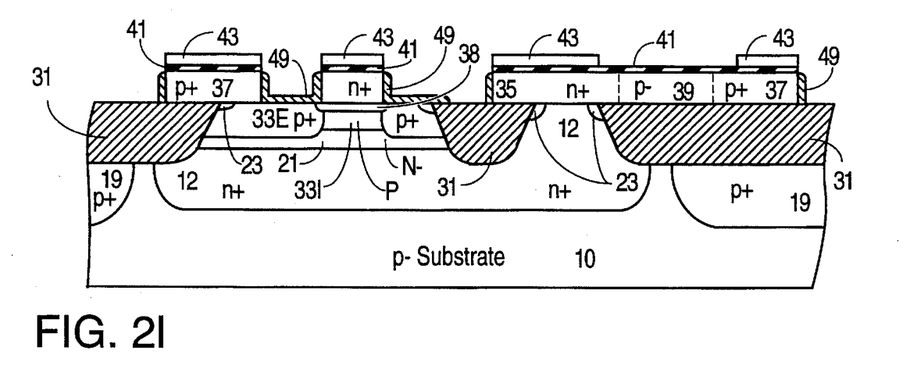
Figure 2M:
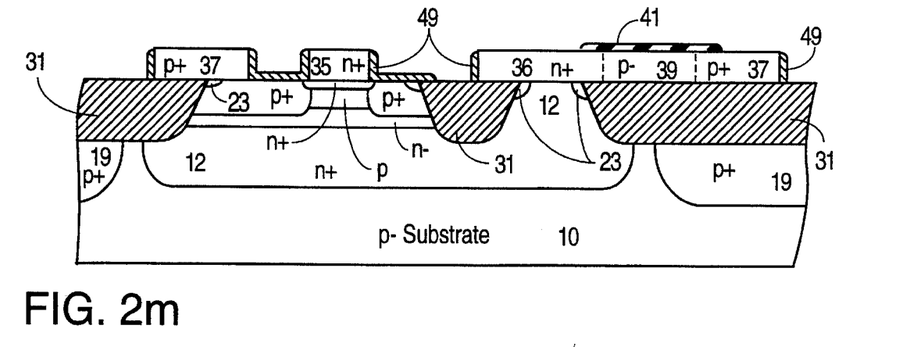
Figure 2N:
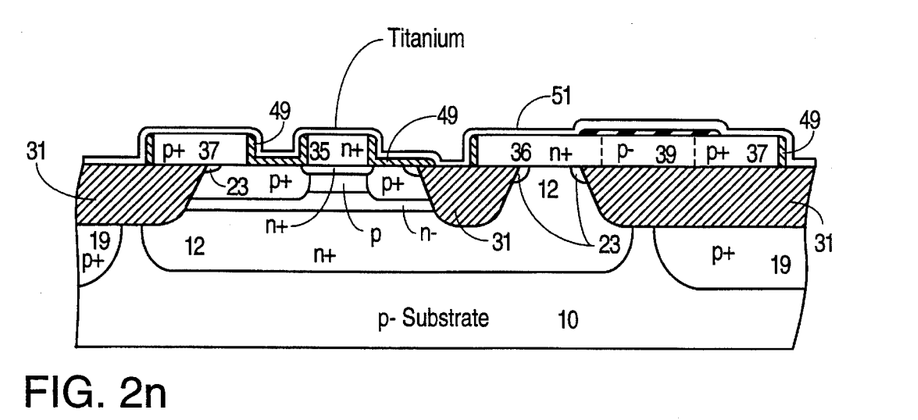
Figure 2O:
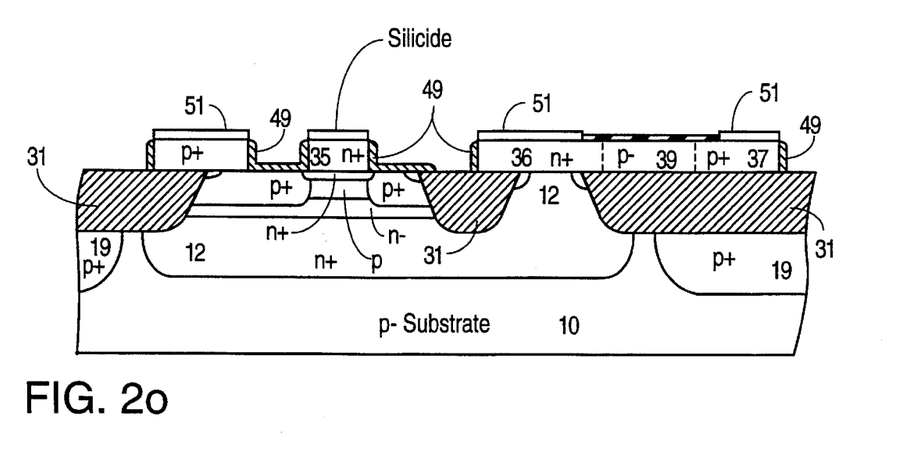

FIGS. 2a through 2o illustrate those steps in the fabrication of the bipolar device illustrated in FIG. 1 that are particularly relevant to the understanding of the present invention.

FIG. 2a is a cross-section of the devices at a first stage of its fabrication. To reach this stage, the P-semiconductor substrate was denuded (heated for removal of oxygen), and an initial oxide layer formed. The device was then masked for implant of the N+ buried layer. The oxide layer is then etched from the nonmasked areas, after which a thin implant protection oxidation layer is grown over the etched areas. Next, the N+ buried layer implantation occurs. The implant energy used for formation of region 12 is preferably about 50 to 200 KeV with a preferred range of between about 60 to 80 KeV such that the peak dopant concentration of region 12 is ultimately between about $5\times10^{17}$ to $2\times10^{20}$ with a preferred range of about $1\times10^{14}$ and $1\times10^{20}/cm^3$.

The mask is removed and the buried layer is then annealed and further oxidized. This step is shown in FIG. 2b. The oxide layer is stripped and a thin field implant protection oxide 11 is grown. The device is then masked for the P+ channel stop implant and the P+ channel stop is implanted. The implant energy used in formation of the channel stop regions 19 is preferably between about 50 to 200 KeV with a preferred range of 140 to 200 KeV such that the peak dopant concentration of the P+ channel stop is ultimately between about $1\times10^{17}$ and $1\times10^{18}/cm^3$. The p+ regions preferably are doped with boron. The resist is removed and the device is annealed.

As shown in FIG. 2c, the channel stop and oxide are then removed and a doped n-type epitaxial silicon layer 21 having a thickness of, for example, about 1.1 μm is grown across the surface of the substrate and a thin oxide layer 25 is formed thereon. After depositing sandwiched layers of thermal nitride 27 and oxide 29, a photoresist mask is formed over the surface to define the field oxide regions. The deposited oxide and nitride layers are then etched away from the unmasked areas. A thin oxide layer remains over the epitaxial silicon layer in those areas where the nitride layer has been stripped away.

The three process steps following the nitride etch, shown in FIGS. 2c and 2d, comprise the boron implantation which, after further process steps, forms a more heavily doped region at the intersection of the isolation oxide and the base region. The boron is first implanted into the areas where the nitride layer has been etched away using an implant energy of between about 40 and 60 KeV with a dose of about $10^{10}$ to $10^{13}$ with a preferred implant energy of about 50 KeV and a preferred dose of about $10^{11}$ to $10^{12}$. Next, the mask on the remaining nitride layer is etched away. Finally, the boron implant is annealed. As shown, lateral diffusion of the boron will occur such that the p+ region extends under the masked nitride regions. Preferably, the anneal is conducted such that the p-n junction from this implant diffusion is a few μm from the edge of the overlying materials mask.

Following the annealing of the boron implant, both an oxide and silicon etch occur, with the resulting wafer cross-section shown in FIG. 2d. Most of the boron implanted silicon is removed, such that the boron implants now occupy only small areas 23. These areas comprise the portion of the implant which diffuses under the nitride mask and any remaining portion of the implant resulting from a non-vertical etch.

Next, as shown in FIG. 2e, the field oxide regions are grown. This oxidation step preferably occurs in steam at high pressure (approximately 10 atmospheres). The field oxide regions push up under the remaining nitride layers 27, forming a "bird's beak" comprising the extension of the newly grown oxide layer into the oxide layer between the nitride and n-area. P-type boron implant areas 23 remain in the n-material, directly below the bird's beak region.

After the field oxidation has been formed, a nitride strip occurs. A planarization oxidation step follows the nitride strip, substantially leveling the surface of the wafer. The resulting structure is illustrated in FIG. 2f. After a bird's beak planarization with resist etchback and another thin oxidation, a mask is formed exposing only sink region 12. As shown in FIG. 2g, a sink implant is then performed using phosphorus as the dopant with an implant energy of about 100 to 190 KeV and a concentration of between about $1\times10^{14}$ and $1\times10^{16}$. The resulting dopant concentration in the sink region 12 is between about $1\times10^{18}$ and $1\times10^{20}/cm^3$. After the implant is annealed, an unmasked base implant takes place to form base region 33.

A polysilicon layer is then deposited and selectively implanted with dopants for formation of the various contacts, as shown in FIG. 2h. A nitride 43/oxide 41 layer is deposited and the device is annealed at about 800°–900° C., as shown in FIG. 2i. A resist mask 45 is then formed as shown in FIG. 2j and the polysilicon is etched, followed by an extrinsic base implant 47. In the portion of region 23 exposed to the extrinsic base implant the regions 23 have only a small impact on the total dopant concentration.

As shown in FIG. 2k, a silicide exclusion mask is formed, followed by a nitride etch. As shown in FIG. 2l, the device is then annealed and oxidized; the nitride and a thin layer of oxide are then stripped, leaving sidewall oxide 49, as shown in FIG. 2l. During an anneal, dopants are diffused from the overlying contacts to form the emitter region 38, and remaining portions of the extrinsic base region 33E. A nitride strip and thin oxide strip are then conducted, leaving the structure as shown in FIG. 2m. Titanium is then deposited as shown in FIG. 2n across the entire surface of the device and heated to react with underlying silicon to form silicide regions 51 as shown in FIG. 2m. Unreacted metal is then removed and the device is then again heated for further reaction with the silicon as shown in FIG. 2o.

The remaining process steps required to form the BJTs are described in U.S. Pat. No. 5,139,961 entitled "High Performance Semiconductor Devices." Following the steps described therein results in the device shown in FIGS. 1a and 1b. That application is incorporated by reference herein for all purposes.

It is to be understood that the above description is intended to be illustrative and not restrictive. Many variations of the invention will become apparent to those of skill in the art upon review of this disclosure. Although the invention has been illustrated with regard to specific dopant concentrations in some instances, it should also be clear that a wide range of dopant concentrations may be used for many features of the devices herein without departing from the scope of the inventions herein. Moreover, the types of dopants (i.e., N-type and P-type) used to form the various device components could be changed to form a PNP transistor in accordance with the present invention. The scope of the invention should, therefore, be determined not with reference to the above description, but instead should be determined with reference to the appended claims along with their full scope of equivalents.

I claim:

1. A method for forming a base and an emitter in a bipolar transistor, the base having a first conductivity type, and the emitter having a second conductivity type opposite the first conductivity type, the method comprising the steps of, in sequence:

forming a mask over a base region of a substrate, the mask including an opening exposing a portion of the substrate where a field oxide region is to be formed;

implanting dopants of the first conductivity type into the exposed portion of the substrate where the field oxide region is to be formed;

diffusing the dopants from the implant laterally under a portion of the mask into the base region;

etching the exposed portion of the substrate where the field oxide region is to be formed, leaving the laterally diffused dopants beneath the mask as a diffusion compensation region;

forming the field oxide region in the exposed portion of the substrate;

wherein the diffusion compensation region abuts a sidewall of the field oxide region;

forming the base in the base region, the base having a dopant concentration lower than the diffusion compensation region, the base laterally contacting the diffusion compensation region;

forming the emitter above the base; and forming a sidewall oxide region above the diffusion compensation region, wherein the emitter abuts the sidewall oxide region above the diffusion compensation region.

2. The method according to claim 1 wherein the step of forming the base comprises the step of implanting dopants of the first conductivity type into the base region.

3. The method according to claim 1 wherein the step of forming the emitter comprises the steps of:

depositing a layer of polysilicon over the base region;

doping the polysilicon layer with dopants having the second conductivity type;

etching the layer of polysilicon to form a polysilicon emitter contact and to expose portions of the base region;

implanting dopants of the first conductivity type into the exposed portions of the base region; and annealing the substrate so that a portion of the dopants in the polysilicon emitter contact diffuse into the substrate to form the emitter.

4. The method according to claim 1 wherein the first conductivity type is a p conductivity type.

5. A method of forming a bipolar transistor, the method comprising the steps of:

forming a buried layer having a first conductivity type in substrate having a second conductivity type opposite the first conductivity type;

growing an epitaxial silicon layer having the first conductivity type above the buried layer;

forming a mask over a base region and over a collector sink region of the epitaxial silicon layer, the mask including an opening exposing a portion of the epitaxial silicon layer between the base region and the collector sink region where a field oxide region is to be formed;

implanting dopants of the first conductivity type into the exposed portion of the epitaxial silicon layer where the field oxide region is to be formed;

diffusing the dopants from the implant laterally under a portion of the mask into the base region;

etching the exposed portion of the epitaxial silicon layer where the field oxide region is to be formed leaving the laterally diffused dopants beneath the mask as a diffusion compensation region in the base region;

forming the field oxide region in the exposed portion of the epitaxial silicon layer;

wherein the diffusion compensation region abuts a sidewall of the field oxide region in the base region; and wherein a portion of the epitaxial silicon layer abuts the sidewall of the field oxide region beneath the diffusion compensation region;

forming the base in the epitaxial silicon layer in the base region, the base having a dopant concentration lower than the diffusion compensation region, and the base laterally contacting the diffusion compensation region; and forming an emitter in the epitaxial silicon layer above the base, wherein the emitter abuts a sidewall oxide formed above the diffusion compensation region, and wherein the portion of the epitaxial silicon layer beneath the base and extending to the collector sink region comprises a collector of the bipolar transistor.

6. The method according to claim 5 wherein the step of forming the base comprises the step of implanting dopants of the first conductivity type into the base region.

7. The method according to claim 5 wherein the step of forming the base comprises the step of forming the base so that the base is vertically thinner than the diffusion compensation region, wherein the diffusion compensation region extends vertically into the epitaxial layer beneath the base.

8. The method according to claim 5 wherein the step of forming the emitter comprises the steps of:

depositing a layer of polysilicon over the base region;

doping the polysilicon layer with dopants having the second conductivity type;

etching the layer of polysilicon to form a polysilicon emitter contact and to expose portions of the base region;

implanting dopants of the first conductivity type into the exposed portions of the base region; and annealing the substrate so that a portion of the dopants in the polysilicon emitter contact diffuse into the base to form the emitter.

9. The method according to claim 5 wherein the first conductivity type is a p conductivity type.

10. A method of forming base, collector, and emitter regions of a bipolar transistor, the method comprising the steps of:

forming a buried layer having a first conductivity type in a substrate having a second conductivity type opposite the first conductivity type;

growing an epitaxial silicon layer having the first conductivity type above the buried layer;

forming a mask over a base region of the epitaxial silicon layer, the mask including first and second openings exposing portions of the epitaxial silicon layer on opposite lateral sides of the base region where corresponding first and second field oxide regions are to be formed;

implanting dopants of the first conductivity type into the exposed portions of the epitaxial silicon layer where the first and second field oxide regions are to be formed;

diffusing the dopants from the implant laterally under the portion of the mask between the first and second openings into the base region;

etching the exposed portions of the epitaxial silicon layer where the first and second field oxide regions are to be formed, leaving the laterally diffused dopants beneath the opposite lateral sides of the mask as first and second diffusion compensation regions in the base region;

forming the first and second field oxide regions in the exposed portions of the epitaxial silicon layer;

wherein the first diffusion compensation region abuts a sidewall of the first field oxide region in the base region;

wherein the second diffusion compensation region abuts a sidewall of the second field oxide region in the base region;

wherein a portion of the epitaxial silicon layer abuts the sidewall of the first field oxide region beneath the first diffusion compensation region; and wherein a portion of the epitaxial silicon layer abuts the sidewall of the second field oxide region beneath the second diffusion compensation region;

forming the base in the epitaxial silicon layer in the base region, the base having a dopant concentration lower than the first and second diffusion compensation regions, and the base extending from the first diffusion compensation region to the second diffusion compensation region; and forming an emitter in the epitaxial silicon layer above the base and the diffusion compensation region, wherein the emitter abuts a sidewall oxide formed above the diffusion compensation region, and wherein the portion of the epitaxial silicon layer beneath the base 11. The method according to claim 10 wherein the step of forming the base comprises the step of implanting dopants of the first conductivity type into the base region.

12. The method according to claim 10 wherein the step of forming the base comprises the step of forming the base so that the base is vertically thinner than the first and second diffusion compensation region, wherein the first and second diffusion compensation regions extend vertically into the epitaxial silicon layer beneath the base.

13. The method according to claim 10 wherein the step of forming the emitter comprises the steps of:

depositing a layer of polysilicon over the base region;

doping the polysilicon layer with dopants having the second conductivity type;

etching the layer of polysilicon to form a polysilicon emitter contact and to expose portions of the base region;

implanting, dopants of the first conductivity type into the exposed portions of the base region; and annealing the substrate so that a portion of the dopants in the polysilicon emitter contact diffuse into the substrate to form the emitter.

14. The method according to claim 10 wherein the first conductivity type is a p conductivity type.

* * * * *